United States Patent [19]

Hirao et al.

[11] 3,716,404

[45] Feb. 13, 1973

[54] PROCESS FOR DOPING WITH IMPURITIES A GAS-PHASE-GROWN LAYER OF III-V COMPOUND SEMICONDUCTOR

[75] Inventors: Motohisa Hirao; Yutaka Takeda, both of Tokyo, Japan

[73] Assignee: Mitachi, Ltd., Tokyo, Japan

[22] Filed: Sept. 11, 1970

[21] Appl. No.: 71,474

[30] Foreign Application Priority Data

March 2, 1970 Japan ................................45/17777
Sept. 12, 1969 Japan ................................44/71995

[52] U.S. Cl.................117/201, 117/106 A, 148/1.5, 148/175

[51] Int. Cl. ............................B44d 1/02, H01l 7/36

[58] Field of Search....117/201, 106 A; 148/1.5, 171, 148/174

[56] References Cited

UNITED STATES PATENTS

| | | | |
|---|---|---|---|
| 3,577,286 | 5/1971 | Berkenblit et al. | 117/106 A X |
| 3,589,936 | 6/1971 | Tramposch | 117/106 A X |
| 3,310,425 | 3/1967 | Goldsmith | 117/106 |
| 3,387,163 | 6/1968 | Queisser | 148/1.5 X |
| 3,484,713 | 12/1969 | Fenner | 148/1.5 X |
| 3,560,275 | 2/1971 | Knessel et al | 148/171 |

*Primary Examiner*—Alfred L. Leavitt
*Assistant Examiner*—Kenneth P. Glynn
*Attorney*—Craig, Antonelli, Stewart & Hill

[57] ABSTRACT

A process for doping a semiconductor material with an impurity source of $SnI_4$, $SnBr_4$, $GeI_4$, $GeBr_4$, combinations thereof or a mixture of S and $S_2Cl_2$ by vaporizing the impurity source at a temperature of from 0° to 20°C. and then transferring the vapor with a carrier gas into contact with a semiconductor layer composed of a III–V compound in the course of its gas-phase growth. In this manner, it is possible to regulate the concentration of doping impurity, such as Sn, Ge or S, over a full range of lower concentrations (such as $10^{15}$–$10^{18}$ $cm^{-3}$) with semiconductor materials such as GaAs, GaP, GaPAs and InAs.

16 Claims, 2 Drawing Figures

INVENTORS

MOTOHISA HIRAO AND YUTAKA TAKEDA

BY

Craig, Antonelli, Stewart + Hill

ATTORNEYS

PROCESS FOR DOPING WITH IMPURITIES A GAS-PHASE-GROWN LAYER OF III-V COMPOUND SEMICONDUCTOR

BACKGROUND OF THE INVENTION

This invention relates to semiconductors. More particularly, it relates to a procedure for introducing tin and/or germanium or sulfur as impurities into a semiconductor layer composed of III-V compounds during the course of gas-phase growth.

A number of ways of doping semiconductors with impurities in the course of their growth in the gas phase are known in the prior art. They are divided into three classes in accordance with the types of vaporization processes used for the doping material.

The first type involves doping agents which are gaseous at room temperature. This class of doping process has many disadvantages. First of all, it is difficult to keep the dilution ratio of doping agent (diluted with hydrogen) constant, which causes the impurity concentration to fluctuate during the process. Secondly, even if the dilution is kept at a low value of around 10 p.p.m., a high value of impurity concentration of around $10^{18}$ $cm^{-3}$ is obtained, which makes it necessary to repeat further dilutions in several steps in order to attain a sufficiently low concentration.

The second type of procedure used in the art comprises keeping solid doping materials at higher temperatures. Thus, zinc, sulfur, selenium, tin and the like are employed as impurities for GaAs in this type of procedure. However, the vapor pressure of the doping agent is generally so low at room temperature that the doping materials must be heated to higher temperatures in order to perform the desired doping under the vapor-pressure control. Hence, one of the decided disadvantages of this type of process is that very complicated apparatus is required because of the necessity for effecting an exact temperature control of the doping material and of preventing cooling of the vapor during the transfer into the reactor.

In the third type of procedure used in the art, liquid doping materials such as $SnCl_4$ and $S_2Cl_2$ are employed. The fact that these materials are in liquid form at ambient temperature indeed favors the doping processes, and they are suitable for doping for levels near $10^{18}$ $cm^{-3}$. However, the vapor pressures of such simple compounds are too high to be applied in cases where it is required that the doping level is in the range from $10^{15}$ to $10^{17}$ $cm^{-3}$. Hence, the great disadvantage remains that, again, a very complicated device is required in order to structure this type of doping process for the various levels of concentrations which may be required or desired.

One of the objects of the present invention is to provide a process for regulating the concentration of doping impurity, such as Sn, Ge or S, over a full lower level range in semiconductor materials composed of III-V compounds.

Another object of the invention is to provide a doping procedure for semiconductors which overcomes the disadvantages and deficiencies of the prior art.

A further object of the invention is to provide a novel process for doping a gas-phase grown layer of III-V compound semiconductor material during the course of gas-phase growth.

A still further object of the invention is to provide a process for doping a III–V compound semiconductor layer within and/or germanium or sulfur as impurities.

Yet another object of this invention is to provide a process for doping a III–V compound semiconductor in the course of gas-phase growth with tin and/or germanium, or with sulfur, as impurities wherein the resultant concentration of impurities in the semiconductor material can be varied within a wide range of lower concentration level of about $10^{15}$ – $10^{18}$ $cm^{-3}$, the doping materials being kept at nearly ambient temperatures so that the process can be controlled without difficulty.

These and other objects and advantages of the present invention will become apparent to those skilled in the art from a consideration of the following specification and claims, taken in conjunction with the accompanying drawing.

SUMMARY OF THE INVENTION

In accordance with the present invention, it has been found that the aforementioned objectives are attained by doping semiconductors composed of the III-V compounds with tin and/or germanium, especially employing $SnI_4$, $SnBr_4$, $GeI_4$ or $GeBr_4$ as doping agents either individually or in different combinations.

The melting and boiling points of these materials are shown in the following table:

TABLE 1

| Doping Agent | M.P. (°C.) | B.P. (°C.) |
|---|---|---|
| $SnI_4$ | 160 | 295 |
| $SnBr_4$ | ~30 | 203 |
| $GeI_4$ | 144 | 350–400 |
| $GeBr_4$ | 26.1 | 185–189 |

These compounds are all stable at room temperature and have suitable vapor pressures to give an impurity concentration of $10^{15}$ – $10^{18}$ $cm^{-3}$. Furthermore, they all belong to halogenides of similar families and of similar types, and they are capable of forming a continuous series of solid solutions. Hence, the composition ratios can be varied in such a manner that the vapor pressure over the solid solution may take any desired value between those of the two elemental components thereof.

The objectives of the present invention may also be attained by forming an n-type epitaxial layer, the impurity concentration of which is $10^{15}$ – $10^{18}$ $cm^{-3}$, with a simple apparatus wherein a small quantity of $S_2Cl_2$ is dissolved in sulfur to give a doping material [$S_2 + S_2Cl_2$ π having a higher vapor pressure than elemental sulfur, keeping the obtained doping material in the range from 0°C. to room temperature (that is, about 20°C.), which is the most preferred region for the control of impurity concentrations, controlling the blending ratio of $S/S_2Cl_2$ of the doping agent over a range from about 10:1 to about 500:1, and adjusting the flow of hydrogen which functions as a diluent for the doping agent.

DETAILED DESCRIPTION OF THE PREFERRED EMBODIMENTS AND EXAMPLES OF THE INVENTION

Figures 1, 2:
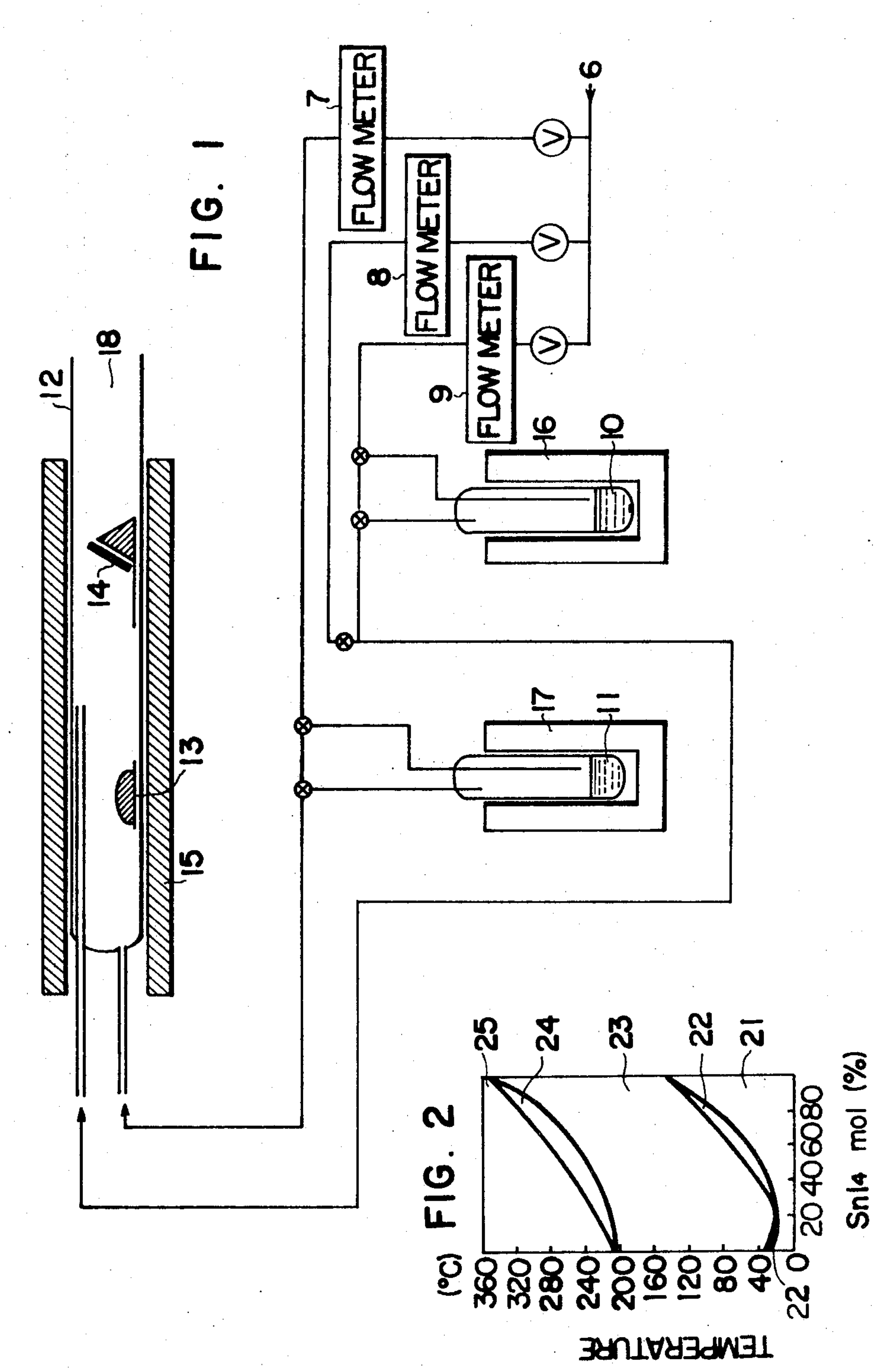
FIG. 1 diagrammatically illustrates an apparatus employed in conjunction with the present invention.
FIG. 2 is the phase diagram for a continuous series of solid solutions of $SnBr_4$-$SnI_4$.

The following examples are given merely as illustrative of the present invention and are not to be considered as limiting.

EXAMPLE 1

In this example, the semiconductor bulk material is composed of GaAs and the impurity source is $SnI_4$. FIG. 1 is a diagrammatic illustration of an apparatus used for forming the presently described doped semiconductor material.

In FIG. 1, 6 is an inlet tube for pure hydrogen, while 7, 8 and 9 represent, respectively, hydrogen flow-meters for $AsCl_3$, a by-path and the doping agent systems. The numeral 10 is a reservoir for the doping agent in accordance with the present invention, 11 is a reservoir for $AsCl_3$, 12 is a reactor tube, 13 is a Ga source, 14 is a semi-insulating substrate, 15 is an electric furnace, 16 and 17 are thermostats for the doping agent and $AsCl_3$, respectively, for keeping these materials at constant temperatures, and 18 is a vent.

Doping agent reservoir 10 in FIG. 1 was charged with $SnI_4$, while the thermostats 16 and 17 were kept at 0°C. Hydrogen gas streams, flowing at the equal rate of 40 cc/minute, were run through the hydrogen inlet tubes 7, 8 and 9. The Ga source 13 was kept at 850°C. Thus, GaAs crystallized on the semi-insulating substrate 14, which was kept at 750°C. for a period of about 5 hours. After this time, an n-type layer, the impurity concentration of which amounted to $1 \times 10^{15}$ $cm^{-3}$ and the electron mobility of which amounted to 7,500 $cm^2$/V/sec, was obtained.

In a control experiment, wherein the same procedure was conducted but without the doping of any impurities, an n-type layer having an impurity concentration of $2 \times 10^{14}$ $cm^{-3}$ was obtained. From these results, it is concluded that a doping in the amount of $1 \times 10^{15}$ $cm^{-3}$ is effected following the procedure of this invention.

EXAMPLE 2

Doping agent reservoir 10 was charged with $SnBr_4$, and the operation was conducted in a manner similar to that described in Example 1. A crystal of GaAs was formed on the semi-insulating substrate 14 as an n-type layer having an impurity concentration of $1 \times 10^{18}$ $cm^{-3}$, keeping the thermostat 16 at 60°C. and introducing the hydrogen in the inlet tubes 7, 8 and 9 at an equal rate of 40 cc/minute.

EXAMPLE 3

The phase diagram of a continuous series of solid solutions of $SnBr_4$-$SnI_4$ is shown in FIG. 2, wherein 21, 22, 23, 24 and 25 represent solid, solid-liquid coexisting, liquid, liquid-gas coexisting and gaseous states, respectively. As is apparent from FIG. 2, $SnBr_4$ forms a solid solution with $SnI_4$ at any optional molar ratio, and it is possible to obtain any desired intermediate values of vapor pressure between those of the two elemental components by adequately choosing the composition ratio. The vapor can be introduced over the solid solution in the reactor system together with a carrier gas ($H_2$) to bring a wide variation of impurity (Sn) concentration to the doping system.

Thus, a solid solution of $SnBr_4$-$SnI_4$ (composed of 60 mole percent of $SnI_4$) was employed in a process similar to that described in Examples 1 and 2 to give an n-type growth layer, the impurity concentration of which was $1 \times 10^{17}$ $cm^{-3}$. Using a $H_2$ gas flow rate only in the inlet tube 9 which is twice as high as the flow rate in the other tubes, an impurity concentration of $2 \times 10^{17}$ $cm^{-3}$ was obtained. In another case, when the temperature of the thermostat was held at 20°C. and the flow of $H_2$ through the tube 9 was 40 cc/minute, an n-type layer having an impurity concentration of $3 \times 10^{17}$ $cm^{-3}$ was obtained. It is possible to control the impurity concentration optionally within a range of about $1 \times 10^{17} - 1 \times 10^{18}$ $cm^{-3}$ by controlling the temperature of the thermostate 16 within the range of 0°– 20°C. and by adjusting the flow rate of $H_2$ in the tube 9 appropriately.

EXAMPLE 4

A solid solution system of $SnBr_4$-$SnI_4$ (containing 80 mole percent of $SnI_4$) was treated similarly as in Example 1 to give an epitaxial layer having an impurity concentration of $1 \times 10^{16}$ $cm^{-3}$. By controlling the temperature of the thermostat 16 within the range of 0°–20°C. and the $H_2$ flow in the tube 9 adequately, it is possible to regulate the impurity concentration optionally in the range of $1 \times 10^{16} - 1 \times 10^{17}$ $cm^{-3}$.

EXAMPLE 5

A solid solution system of $GeBr_4$-$GeI_4$ (containing 60 mole % of $GeI_4$) was treated similarly as in Example 1 to give an epitaxial layer having an impurity purity concentration of $2 \times 10^{17}$ $cm^{-3}$.

Solid solution systems of $GeI_4$-$SnI_4$ and $GeBr_4$-$SnI_4$ gave nearly the same results as those obtained using $GeI_4$ and $GeBr_4$, respectively.

EXAMPLE 6

The $AsCl_3$ reservoir 11 was charged with $PCl_3$, instead of $AsCl_3$. The temperature of the Ga source was maintained at 950°C., while that of the GaAs substrate was kept at 850°C. The other conditions were the same as described in Example 1. As a result, an n-type layer of GaP, the impurity concentration of which was $2 \times 10^{15}$ $cm^{-3}$, was obtained.

Modifying the procedure of Examples 2–5 by replacing As with P, keeping the other conditions unchanged, resulted in impurity concentrations which are nearly two times as high as compared with the corresponding GaAs crystals.

The process of the present invention, when used for doping III–V compound semiconductors such as GaAs with n-type impurities during the course of gas-phase growth, makes it possible to obtain a stable doping with a relatively simple apparatus. The GaAs semiconductor obtained by this process can be effectively used for Gunn-diodes, etc. The process of the present invention is also applicable for doping crystals for light-emitting diodes made of III-V compounds, such as GaP, GaP-GaAs, etc., with n-type impurities.

EXAMPLE 7

The doping of gas-phase grown layers of III–V compound semiconductors with sulfur can be carried out in the following manner. At first, the doping material placed in the thermostat 10 was prepared by adding 0.5 cc. of liquid $S_2Cl_2$ to 5 g. of pure sulfur powder, heating the resultant mixture to 50°C. to accomplish fusion, and then cooling the mixture to give a solid. This solid is referred to as the doping material A. A mixture of 0.2 g. of the doping material A and 5 g. of sulfur powder was fused at 150°C. and was then cooled to give a solid. This is referred to herein as doping material B. A mixture of 0.2 g. of the doping material B and 5 g. of sulfur powder was again fused at 150°C. and then cooled to give a solid. This is referred to herein as doping material C.

The doping material A was placed in the thermostate 10. The electric furnace 15 was heated in order to keep the temperatures of 13 (Ga source) and 14 GaAs substrate) at about 850°C. and about 750°C., respectively. (It is to be noted that the temperature was kept at about 950°C. when the source utilized was P and at about 750°C. when it was In. The temperature of 14 was kept at about 850°C. when 14 was GaP and at about 750°C. when 14 was InAs.) When the temperature of $AsCl_3$ in the thermostat 11 was maintained at 0°C., the flow-meters 7, 8 and 9 were adjusted so that the hydrogen gas flowing over the doping material A, over the $AsCl_3$ and through the by-path were all 40 cc/minute, and the temperature of the doping material A was kept at 0°C., an epitaxial layer, the impurity concentration of which was $2 \times 10^{18}$ $cm^{-3}$, was formed on the substrate 14. In another case, when the hydrogen stream over the doping material A was adjusted to 20 cc/minute, the obtained impurity concentration was $1 \times 10^{18}$ $cm^{-3}$. Hence, an epitaxial layer, the impurity concentration of which ranged from $1 \times 10^{18}$ $cm^{-3}$ to $5 \times 10^{18}$ $cm^{-3}$, was obtained by controlling the flow rate of hydrogen or by varying the temperature of the doping material A within the range of about 0°–20°C.

The doping material B, in a similar manner, produced an n-type layer, the impurity concentration of which ranged from $1 \times 10^{17}$ $cm^{-3}$ to $2 \times 10^{18}$ $cm^{-3}$, while the doping material C similarly produced an n-type layer, the impurity concentration level of which was $5 \times 10^{15}$ $cm^{-3}$.

In this manner, an epitaxial layer having an n-type impurity concentration ranging from $10^{15}$ to $10^{18}$ $cm^{-3}$ can be prepared with an apparatus as simple as that shown in FIG. 1 by employing a mixture of S and $S_2Cl_2$ as doping material, varying the blending ratio of these materials over a range from 10:1 to 500:1, varying the temperature of the doping material over a range from 0°C. to room temperature (20°C.), and controlling the flow rate of hydrogen gas over the doping material.

In the preceding Examples, only the case where an n-type epitaxial layer was formed on a GaAs substrate was described, but it is obvious that other III-V compound semiconductors can also be doped similarly. For example, GaP and InAs are doped by employing sources of Ga and In, respectively, and substrates of GaP and InAs, respectively, and replacing $AsCl_3$ with $PCl_3$ in the case of GaP, while keeping the other conditions similar to the case of the use of GaAs.

The invention being thus described, it will be obvious that the same may be varied in many ways. Such variations are not to be regarded as a departure from the spirit and scope of the invention, and all such modifications as would be obvious to one skilled in the art are intended to be included herein.

We claim:

1. In a process for doping a vapor-phase epitaxial layer of a III–V compound semiconductor with at least one element selected from the group consisting of Sn, Ge and S during the course of epitaxial growth on a substrate of said semiconductor, by introducing a carrier gas containing a vapor of the same semiconductor as the substrate onto said substrate and by growing a layer of said semiconductor on said substrate in contact with said vapor phase, the improvement which comprises evaporating an impurity source of dopant selected from the group consisting of solid solutions obtained from combinations of $SnI_4$, $SnBr_4$, $GeI_4$, and $GeBr_4$, and mixtures of S and $S_2Cl_2$ and introducing the gas released from said impurity source onto said substrate with said carrier gas.

2. The process of claim 1, wherein the impurity source is selected from the group consisting of solid solutions of $SnI_4$ and $SnBr_4$, solid solutions of $GeI_4$ and $GeBr_4$ and mixtures of S and $S_2Cl_2$.

3. The process of claim 1, wherein the impurity source is a solid solution of $SnI_4$ and $SnBr_4$.

4. The process of claim 1, wherein the impurity source is a solid solution of $GeI_4$ and $GeBr_4$.

5. The process of claim 1, wherein the impurity source is a mixture of S and $S_2Cl_2$.

6. The process of claim 1, wherein the impurity source is evaporated at a temperature of from 0° to 20°C.

7. The process of claim 5, wherein the impurity source is evaporated at a temperature of from 0° to 20°C.

8. The process of claim 1, further comprising the step of controlling the amount of impurity carried from the impurity source onto said substrate by regulating the flow rate of the carrier gas.

9. The process of claim 5, further comprising the step of controlling the amount of impurity carried from the impurity source onto said substrate by regulating the flow rate of the carrier gas.

10. The process of claim 5, wherein the ratio of S and $S_2Cl_2$ is between 10:1 and 500:1 by weight.

11. The process of claim 10, further comprising the step of controlling the amount of impurity carried from the impurity source onto said substrate by regulating the flow rate of the carrier gas.

12. The process of claim 1, wherein said compound semiconductor is selected from the group consisting of GaAs, GaP, GaPAs and InAs.

13. The process of claim 1, wherein the resultant concentration of impurity dopant in the semiconductor is about $10^{15}$ to $10^{18}$ $cm^{-3}$.

14. The process of claim 1, wherein the carrier gas is hydrogen.

15. The process of claim 2, wherein the concentration of impurity dopant in the semiconductor is varied by varying the molar ratios of the constituents in the solid solutions and mixtures.

16. The process of claim 15, wherein the temperature of the solid solutions is maintained at a temperature from about 0° to about 20°C.

* * * * *